(12) United States Patent
Nishiguchi et al.

(10) Patent No.: US 6,445,800 B1
(45) Date of Patent: *Sep. 3, 2002

(54) AUDIO SIGNAL REPRODUCING APPARATUS

(75) Inventors: Masayuki Nishiguchi; Yoshihito Fujiwara, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/489,774

(22) Filed: Jan. 24, 2000

Related U.S. Application Data (62) Division of application No. 08/747,910, filed on Nov. 12, 1996, which is a division of application No. 07/600,818, filed on Oct. 22, 1990, now Pat. No. 5,640,458.

(30) Foreign Application Priority Data

Oct. 25, 1989 (JP) .......................................... P01-278209

(51) Int. Cl.[7] .............................. H04R 1/10; H03G 5/00
(52) U.S. Cl. .......................... 381/74; 381/98; 704/272; 700/94
(58) Field of Search ................................. 381/2, 61, 98, 381/74, 370, 374, 384, 26; 700/94; 704/229, 226, 227, 228; 84/601, 602, 609

(56) References Cited

U.S. PATENT DOCUMENTS

| 5,056,145 A | * 10/1991 | Yamamoto et al. | .......... 704/270 |
| 5,640,458 A | * 6/1997 | Nishiguchi et al. | ........... 381/74 |
| 5,930,758 A | * 7/1999 | Nishiguchi et al. | .......... 704/500 |
| 6,141,424 A | * 10/2000 | Takiguchi et al. | ............ 381/74 |

* cited by examiner

Primary Examiner—Xu Mei
(74) Attorney, Agent, or Firm—Jay H. Maioli (57) ABSTRACT

A small-sized audio signal reproducing apparatus for hearing reproduced audio signals with the aid of a headphone is disclosed. Digitized and compression encoded audio signals, stored in a semiconductor memory, are read out so as to undergo a decoding operation, which is an inverse operation to compression encoding, to reproduce the audio signals, and the reproduced signals are heard by the headphone. The apparatus may be significantly reduced in size and weight as compared to the apparatus in which a tape or a disk is used as the recording medium.

5 Claims, 5 Drawing Sheets

AUDIO SIGNAL REPRODUCING APPARATUS

This is a division of prior application Ser. No. 08/747,910 filed Nov. 12, 1996, which is a division of application Ser. No. 07/600,818 filed Oct. 22, 1990, now U.S. Pat. No. 5,640,458 issued Jun. 17, 1997.

BACKGROUND OF THE INVENTION

1. Field of the Invention

This invention relates to an audio signal reproducing apparatus and, more particularly, to a small sized audio signal reproducing apparatus in which reproduced audio signals may be heard by a headphone.

2. Description of the Prior Art

Recently, a small sized audio signal reproducing apparatus, in which audio signals may be heard by a headphone, has become popular to provide for a more extensive range of appreciation of music or the like.

With the small sized audio signal reproducing apparatus for hearing the reproduced audio signals with a headphone, there is a demand for further reduction in size and weight since such reduction possibly leads to more widespread use and mode of application.

However, with the above described small sized audio signal reproducing apparatus, magnetic tapes or optical disks, such as, for example, compact disks, are used as the signal recording media, so that the apparatus in its entirety cannot be reduced in size beyond the size of these recording media. On the other hand, since the mechanical parts for driving the recording media are necessitated, the operational reliability may be lowered due to wear or damage to movable parts. The playback operation may also be affected by mechanical disturbances, such as vibrations. In addition, there is a limit to reduction in size and weight due to the use of an electrical motor or a plunger.

Recently, with the progress in the technique of high efficiency compression encoding of audio-signals, high-fidelity playback sounds may now be produced even at the rate of the order of, for example, 64 kb per second per channel. Among the techniques for such high efficiency compression encoding, there are a sub-band coding (SBC) in which audio signals on the time axis are divided into a plurality of frequency bands prior to encoding; an adaptive transform encoding (ATC) in which signals on the time axis are converted by orthogonal transform into signals on the frequency axis which are then divided into a plurality of frequency bands, and adaptive encoding is performed in each of these frequency bands; and an adaptive bit allocation (APC-AB), which is a combination of the above described SAC and an adaptive predictive encoding (APC) and which consists in dividing the signals on the time axis into a plurality of bands, converting the band signals into baseband signals or low-frequency signals and performing plural order linear predictive analyses for predictive encoding.

For compression encoding of audio signals on the left and right stereo channels, it has now become possible to transmit high fidelity stereo audio signals at the transmission rate in the order of 64 kb per second per channel through the use of the correlation between the left and right stereo signal or the use of codes of unequal lengths.

OBJECT AND SUMMARY OF THE INVENTION

It is therefore an object of the present invention to provide a headphone type ultra small size audio signal reproducing apparatus in which high quality audio signal reproduction may be achieved with the small data volume through the use of high efficiency compression encoding and a semiconductor memory as a signal recording or storage medium.

For accomplishing the above object, the present invention provides a headphone type audio signal reproducing apparatus comprising a semiconductor memory for storing digitized and high efficiency compression encoded audio signals, a decoder for reading out data stored in said semiconductor memory and decoding the read-out data, by way of performing an operation which is an inversion of compression encoding, a digital/analog converter for converting output signals from said decoder into analog signals, and a headphone unit for converting output signals from said digital/analog converter into acoustic signals.

As a typical example of the high efficiency compression encoding operation, input signal signals are divided into a plurality of frequency bands so that the bandwidths will be broader for progressively higher frequency bands, the allowable noise level is set on the band-by-band basis in accordance with the energy of each band and the components of each band are quantified with the number of bits corresponding to the level of the difference between the energy of each band and the preset allowable noise level. In presetting the allowable noise level, the allowable noise level is set so as to be higher for the same energy for progressively higher frequencies for minimizing the degradation in the sound quality and reducing the bit rate. In this manner, the requirements for satisfactorily reproducing audio signals with the use of semiconductor memories, that is, the requirements for reproducing so-called high fidelity level audio signals for at least several minutes, may be satisfied.

With the reproducing apparatus of the present invention, which makes use of the semiconductor memory as the signal recording medium, to reduce the size and weight of the apparatus drastically so compared to the reproducing apparatus which makes use of the magnetic tape or optical disk as the recording medium.

That is, since the semiconductor memory is used as the recording medium for high efficiency encoded audio data, not only may the main body of the reproducing apparatus be reduced in size and weight, but the movable parts, such as are necessitated in the conventional reproducing apparatus in which disks or tapes used as recording medium are driven mechanically for reproducing the audio signals, may be eliminated, so that the apparatus superior in service life or in durability may be obtained.

In addition, the masking level is raised for higher frequencies during data compression to reduce the number of bits allocated at the time of quantization to realize the bit allocation suited to the human auditory sense. Thus the degradation in the sound quality may be minimized with the use of a lesser number of bits or a lower bit rate so that the audio signal reproduction may be made satisfactorily with the use of the semiconductor memory chips.

DESCRIPTION OF THE PREFERRED EMBODIMENTS

By referring to the drawings, a preferred embodiment of the present invention will be explained in detail.

Figure 1:
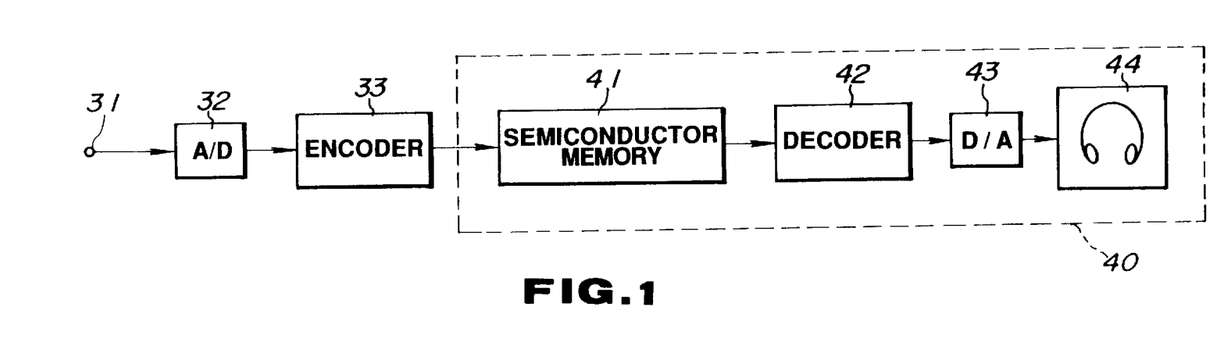
FIG. 1 is a schematic block diagram showing an embodiment of an audio signal reproducing apparatus according to the present invention.

An audio signal reproducing apparatus according to an embodiment of the present invention and the periphery thereof are shown in a block circuit diagram of FIG. 1.

In this figure, audio data which have been processed by high efficiency compression encoding are stored in a semiconductor memory 41 of an audio signal reproducing circuit section 40. That is, the data stored in semiconductor memory 41 are obtained in such a manner that audio signals are supplied to input terminal 31 and are converted in an analog/digital (A/D) converter 32 into digital signals, these digital signals being then processed in an encoder 33 by high efficiency compression encoding. The data read out from semiconductor memory 41 are supplied to a decoder 42, where they undergo a decoding operation which is an inversion of the above mentioned compression encoding operation. These decoded signals are then supplied to a digital/analog (D/A) converter 43 where they are converted into analog signals, which are then transmitted to a headphone unit 44 so as to be converted into acoustic signals.

Figure 2:
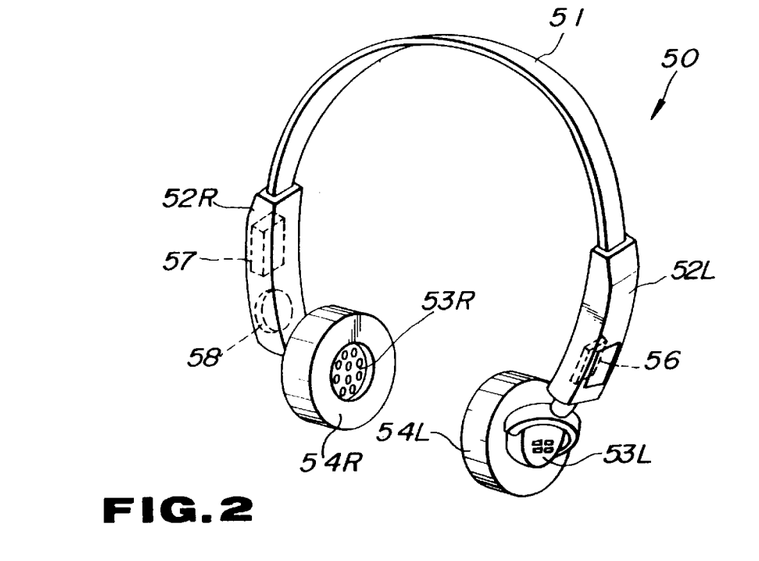
FIG. 2 is a perspective view showing a typical headphone device employed in the audio signal reproducing apparatus shown in FIG. 1.

In FIG. 2, a head device 5 as a specific example of the headphone unit 44, inclusive of associated parts, is shown. The headphone device 50 is constituted by a band 51, band length adjustment members 52L, 52R, connected to both ends of the band 51, headphone driven units 53L, 53R connected to these adjustment members 52L, 52R by means of connectors. and ear pads 54L, 54R mounted on the driver units 53L, 53R.

The circuitry for an audio signal reproducing apparatus is built in the inside of the band length adjustment members 52L, 52R. That is, a memory chip 56 associated with the semiconductor memory 41 is accommodated in the band length adjustment member 52L. This memory chip 56 may be formed as an article of commerce, using, for example, a mask ROM, and put on the market as exchangeable music software goods. In the interior of the other band length adjustment member 52R, there are provided a circuit unit 57 including the decoder 42 and the D/A converter 43 and a so-called button battery or re-chargeable battery 58 which may be used as an electrical power source.

Figure 3:
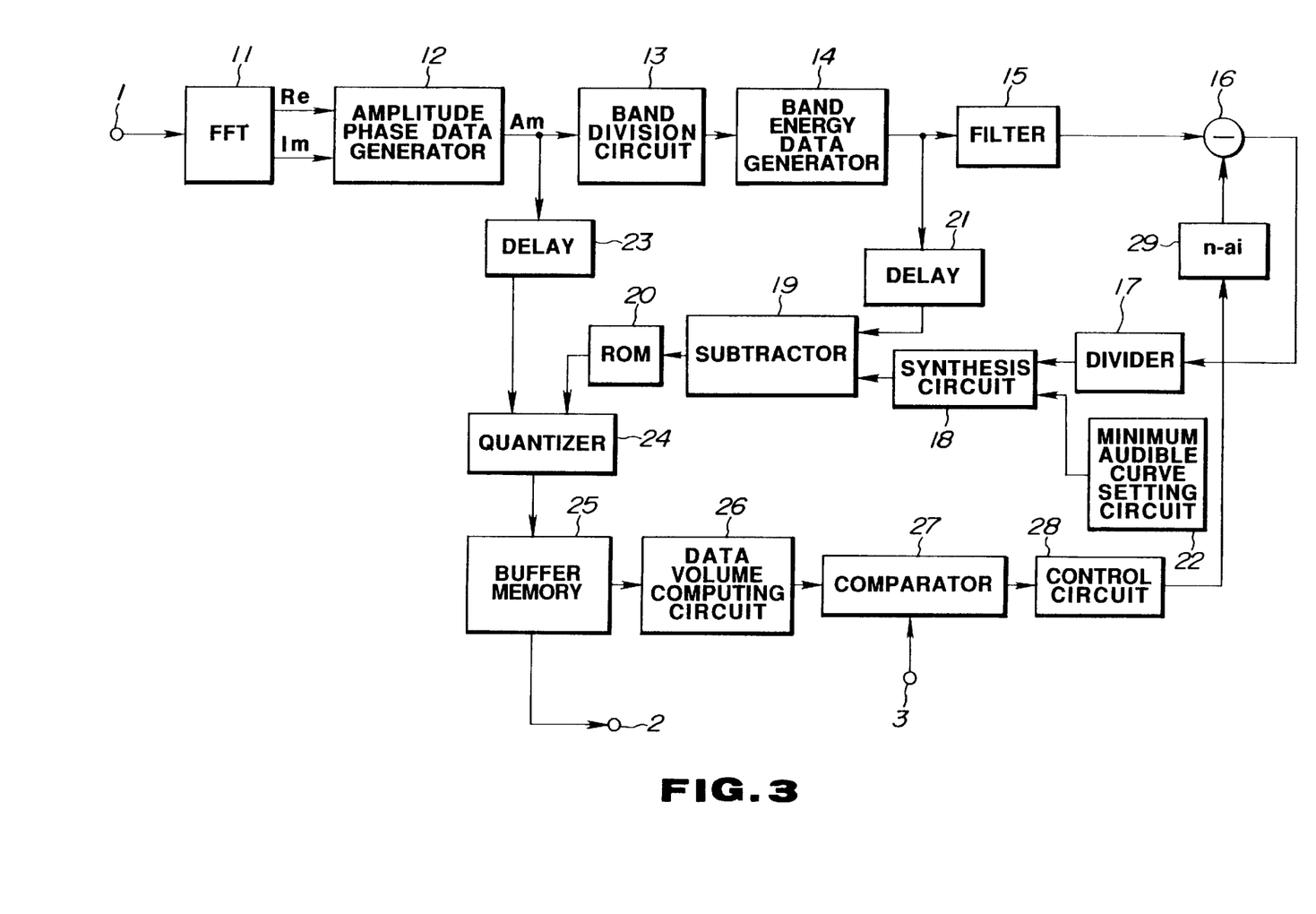
FIG. 3 is a block circuit diagram showing a typical high efficiency compression encoding circuit adapted for generating audio data stored in a semiconductor memory.

Referring to FIG. 3, a more specific example of high efficiency compression encoding for obtaining audio data stored in the semiconductor memory 41 of the audio signal reproducing apparatus of the present embodiment, will be explained.

Among the high efficiency compression encoding techniques, there are a sub-band encoding (SBC), adaptive transform encoding (ACT) or adaptive bit allocation (APC-AB). With the specific example shown in FIG. 3, an arrangement for improving the compression efficiency further is used.

With the specific example of the compression encoding unit, shown in FIG. 3, the digitized audio signals is divided into plural frequency bands which will have broader bandwidths towards the side of progressively higher frequencies. For example, the input digital signal is divided into plural frequency bands in accordance with the so-called critical bands or bandwidths, which take human auditory characteristics into consideration, as will be explained subsequently. On the other hand, referring to FIG. 3, there are provided a sum detection circuit 14 and a filter circuit 15 as noise level setting means for setting the allowable noise level on the band-by-band basis in accordance with the energy value, peak value or the mean value) of each critical band, and a quantization circuit 24 for quantizing the band components by the numbers of bits allocated in accordance with the level of the difference between the signal energy level of each band and the level set by the noise level setting means. The noise level setting means is so constructed that the allowable noise level will be set to a progressively higher level for the same energy towards the side of the higher frequency critical bands to this end, the system of FIG. 3 is so constructed that an allowance function for setting the allowable noise level in an allowance function generator 29 controlled by an allowance function control circuit 28, as will be described subsequently, and the allowable noise level is set on the basis of this allowance function. The quantized output from quantizer 24 is subsequently outputted at an output terminal 2 of the encoder of the present embodiment by way of a buffer memory 25.

The high efficiency compression encoding system shown in FIG. 3 is constructed in accordance with the so-called adaptive transform encoding (ATC) wherein the audio signals are processed by fast Fourier transform (FFT) for conversion of the signal on the time axis into that on the frequency axis, followed by encoding or requantization. In the specific example shown in FIG. 3, bit rate adjustment or so-called bit packing is performed for maintaining a constant bit rate per frame over a predetermined time period.

That is, referring to FIG. 3, audio signals, for example, are supplied to input terminal 1. The audio signals on the time axis are transmitted to a fast Fourier transform circuit 11 where the audio signals on the time axis are converted into signals on the frequency axis at a predetermined time period or at each frame to produce FFT coefficients each consisting of a real number component value Re and an imaginary number component value Im. These FFT coefficients are transmitted to an amplitude phase information generator 12, where an amplitude value Am and a phase value are produced from the real number component Re and the imaginary number component Im. Of these amplitude and phase values, only the data of the amplitude value Am is taken out as output from the amplitude phase information generator 12, since the human auditory sense in general is sensitive to the amplitude or power, but is rather insensitive to the phase, in the frequency domain.

Figure 4:
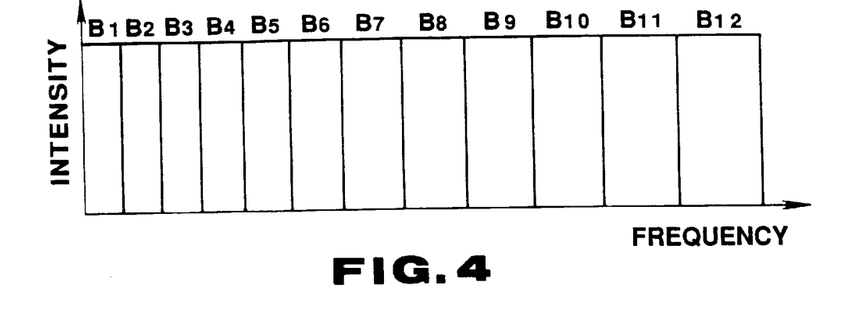
FIG. 4 is a diagrammatic view showing the critical bands.

The so-produced input digital data, such as the amplitude value Am, is transmitted to a band division circuit 13, where the input digital data expressed by the amplitude value data Am are divided into a plurality of so-called critical bands. With the "critical bands", the human auditory characteristics or frequency analysis capability are taken into account in such a manner that the frequency of 0 to 10 kHz is divided into 24 bands, or the frequency of 0 to 32 kHz is divided into 25 bands, so that progressively broader bandwidths are allocated towards the side of the higher frequencies. More specifically, the human auditory sense has characteristics comparable to those of bandpass filters with each band delimited by each bandpass filter being termed a critical band. FIG. 4 shows such critical bands wherein, for simplicity sake, these bands are expressed by 12 bands $B_1$ to $B_{12}$.

Figure 5:
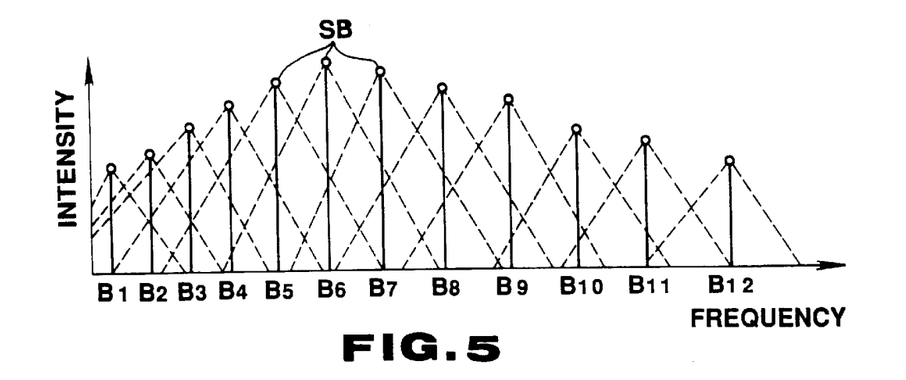
FIG. 5 is a diagrammatic view showing the Burke spectrum.

The amplitude values Am for each of, for example, 24 or 25 critical bands, obtained by band division at the band division circuit 13, are transmitted to the sum detection circuit 14, where the energy or spectral intensity of each band is found by taking the sum of the amplitude values Am in each band or, alternatively by taking the peak or mean value of the amplitude values Am or the sum total of the signal energies. The output of the sum detection circuit 14, that is the spectrum of the sum of the amplitudes, for example, of each bands, is generally termed the Burke spectrum. FIG. 5 shows, as an example, the Burke spectrum SB for each of the bands $B_1$ to $B_{12}$.

Figure 6:
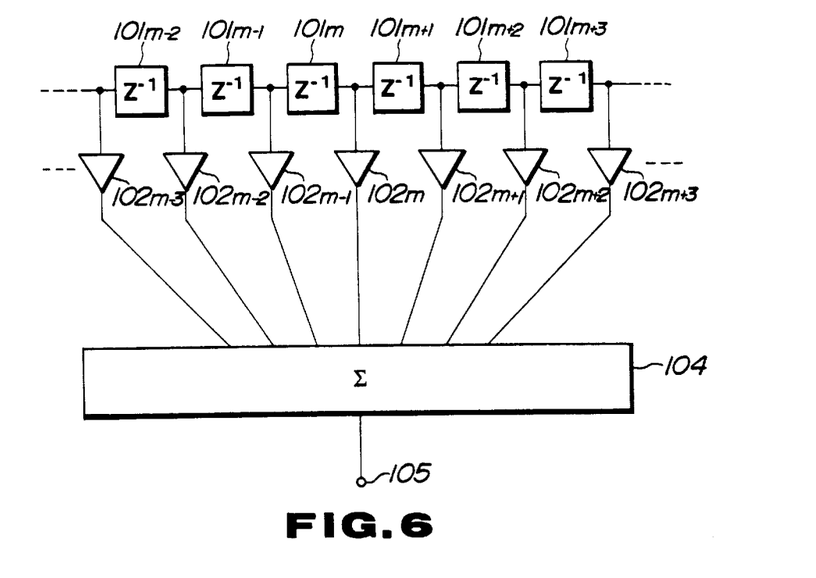
FIG. 6 is a circuit diagram showing a filter circuit.

In order to take the effect of the Burke spectrum SB on masking into account, predetermined weighting functions are convolved into the Burke spectrum SB (convolution). To this effect, the output of the sum detection circuit 14, that is the respective values of the Burke spectrum SB, are transmitted to filter circuit 15. As shown in FIG. 6, the filter circuit 15 is constituted by delay devices ($z^{31}$ $^1$) $101_{m-2}$ to $101_{m+3}$ for sequentially delaying input digital sample data, multipliers $102_{m-3}$ to $102_{m+3}$ for multiplying the outputs from delay devices $101_{m-2}$ to $101_{m+3}$ by filter or weighting coefficients, and a sum circuit 104. The convolving operation for the Burke spectrum SB is performed by multiplying the outputs of the delay devices by filter coefficients 0.0000086, 0.0019, 0.15, 1, 0.4, 0.06 and 0.007 at the multipliers $102_{m-3}$, $102_{m-2}$, $102_{m-1}$, $102_m$, $102_{m+1}$, $102_{m+2}$ and $102_{m+3}$, respectively. The sum total of the Burke spectrum for each band and the influence from adjacent bands indicated by broker lines shown in FIG. 5 is taken by this convolving operation.

It will be noted that, if a level a, corresponding to an allowable noise level for computing the masking spectrum, or an allowable noise spectrum, of the Burke spectrum SB, is low, the masking spectrum or the masking curve descends, with the result that the number of bits allocated at the time of quantization at the quantizer 24 has to be increased. Conversely, if the level a is high, the masking level ascends, with the result that the number of bits allocated at the time of quantization may be decreased. Meanwhile, the level a corresponding to the allowable noise level is such a level as will prove to be the allowable noise level for each critical band as a result of the deconvolution operation, as will be explained subsequently. In general, in audio or the like signals, the spectral intensity or energy is low at higher frequencies. Hence, in the present embodiment, the above is taken into consideration in such a manner that the level a is increased towards the higher frequencies with lesser energy values and the number of the allocated bits is decreased towards the higher frequencies. Thus the noise level setting means is so constructed that the level a is set to progressively higher values towards the side of the higher frequency for the same energy value.

That is, in the present embodiment, the level a corresponding to the above mentioned allowable noise level is computed and controlled to be higher towards the side of the higher frequencies. To this end, the output of the filter circuit 15 is transmitted to a subtractor 16 which is designed to find the level a in the convolved region. To the subtractor 16 is supplied the allowance function (the function expressing the masking level) for finding the level a. The level a may be controlled by increasing or decreasing the allowance function. This allowance function is supplied from a function generator 29 controlled by a function controller which will be explained subsequently.

That is, the level a, corresponding to the allowable noise level, is given by the formula (1)

$$a = S - (n - ai) \tag{1}$$

where i is the number afforded to the critical bands in the order of the increasing frequencies of the critical bands.

In this formula (1), n and a are constants, with a>0, and S is the intensity of the Burke spectrum following the convolution. In the formula (1), (n−ai) represents the allowance function. Since it is more preferred to decrease the number of bits allocated to a higher frequency band with a correspondingly lesser energy value to reduce the number of bits in their entirety, the values of n and a are set in the present embodiment to 38 and 1, respectively (n=38 and a=1) for which satisfactory encoding may be achieved without deterioration in the sound quality.

The level a, found as described above, is transmitted to a divider 17, which is designed for deconvolving the level a in the convolved region. Thus the masking spectrum may be found from the level a by such deconvolving operation. That is, this masking spectrum represents the allowable noise spectrum. Although a complicated operation is necessitated for such deconvolving operation, the deconvolving operation is performed with the present embodiment by using the simplified divider 17.

Figure 7:
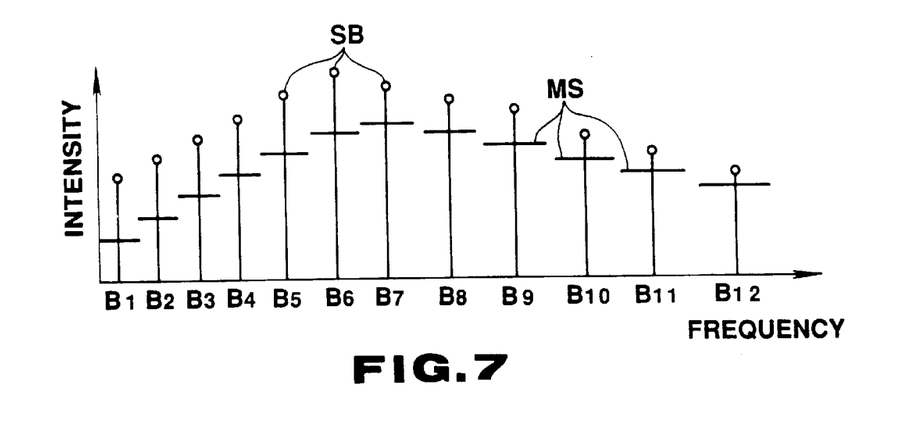
FIG. 7 is a diagrammatic view showing the masking spectrum.

The masking spectrum is transmitted via a synthesis circuit 18 to a subtractor 19, to which the output from the sum detection circuit 14, that is the Burke spectrum SB from the sum detection circuit 14, is supplied by means of a delay circuit 21. Thus the masking spectrum is subtracted at the subtractor 19 from the Burke spectrum SB, so that, as shown in FIG. 7, the Burke spectrum SB is masked at lower than a level indicated by the respective levels of the masking spectrum MS.

The output of the subtractor 19 is supplied to quantizer 24 by means of a ROM 20. In the quantizer 24, the amplitude value Am supplied thereto by means of a delay circuit 23 is quantized with the number of bits allocated in accordance with the output of the subtractor 19. In other words, the components of each critical band are quantized in the quantizer 24 with the number of bits which is allocated in accordance with the level of the difference between the energy of each critical band and the level of the output of the noise level setting means. The delay circuit 21 is designed for delaying the Burke spectrum SB from the sum detection circuit 14 in consideration of the delay caused in each circuit component upstream of the synthesis circuit 18, whereas the delay circuit 23 is designed for delaying the amplitude value Am in consideration of the delay caused in each circuit component upstream of the ROM 20. This ROM is provided for transient storage of the output of the subtractor 19 at a predetermined time interval during quantification for subsequent readout to quantizer 24.

Figure 8:
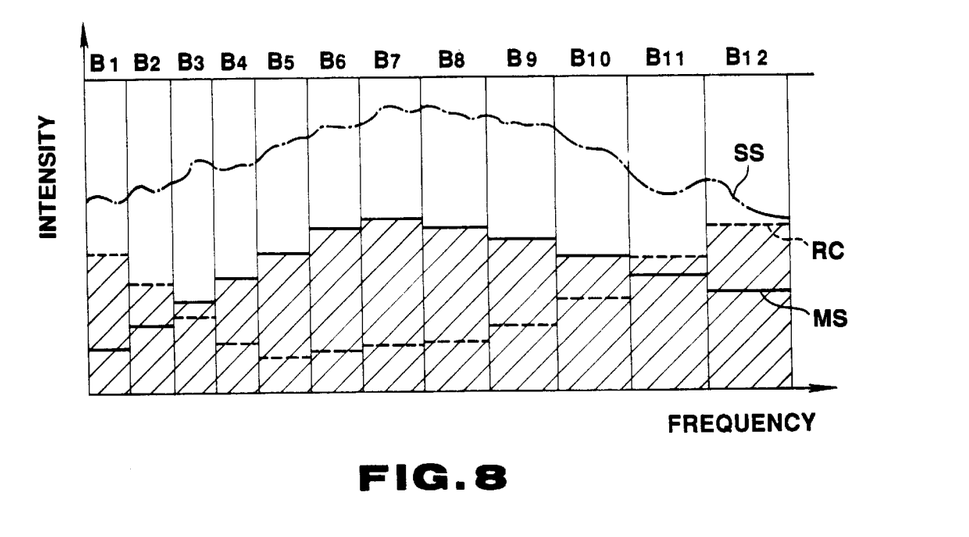
FIG. 8 is a diagrammatic view showing the minimum audible curve and the masking spectrum synthesized together.

It will be noted that the synthesis in the above mentioned synthesis circuit 18 is performed for synthesizing or combining the data for a so-called minimum audible curve or equal loudness curve RC, characteristic of the human auditory sense, supplied from a minimum audible curve generator 22, as shown in FIG. 8, with the above mentioned masking spectrum MS. By combining the minimum audible curve RC with the masking spectrum MS in this manner, the allowable noise level may be set up to the upper limit of the hatched line zone in FIG. 8, so that it becomes possible to reduce the number of bits for the hatched line zone in FIG. 8 at the time of quantification. Meanwhile, critical bands, similar to those shown in FIG. 4, are shown in FIG. 8, along with the signal spectrum SS.

The data from the buffer memory 25 are transmitted to a data volume operating circuit 26 to find a data volume which is then transmitted to a comparator 27. In the comparator, the data volume is compared to a desired value of the number of bits per frame supplied from terminal 3 for bit rate adjustment. The result of comparison is transmitted to the above mentioned function controller 28. This function controller 28 controls the function generator 29 to compute the allowance function to find the level a supplied to the subtractor 16. With changes in this allowance function, the masking spectrum MS of FIG. 8 is variable controlled in level. More specifically, the number of allocated bits may be increased or decreased in their entirety by parallel displacement of the masking spectrum MS in the direction of the signal level, that is, vertically in FIG. 8, with the number of bits transmitted during a predetermined time interval remaining constant. In this manner, the function generator 29 generates not only the allowance function for finding the level a but also the function for bit rate adjustment.

With the above described high efficiency compression encoding apparatus of the present embodiment, the allowable noise level is increased towards the side of the higher frequencies with lower energy values to decrease the number of bits allocated for the side of the higher frequencies, so that it becomes possible to reduce the number of bits allocated for quantization.

It will be noted that, in the present embodiment, the above mentioned bit rate adjustment and/or the minimum audible curve synthesis may be eliminated. That is, if the bit rate adjustment is to be eliminated, the data volume operating circuit 26, comparator 27 and the function controller 28 are eliminated and the allowance function from function generator 29 is fixed to, for example, (38-i). If the minimum audible curve is not synthesized, the minimum curve generator 22 and the synthesis circuit 18 are eliminated, so that the output from subtractor 16 is supplied directly to subtractor, 19 after deconvolution at the divider 17.

With the above described high efficiency compression encoding, high fidelity audio signals may be transmitted at, for example, 64 kbps per channel, so that audio data about 4 minutes or longer may be stored in, for example, a 16 M bit make ROM chip. If four of such mask ROM chips are arranged as a package, music software goods with a playback time of about 17 minutes may be provided as an article of commerce. Although the playback time may be substantially halved for a stereophonic sound source, the number of bits per channel may be reduced further by taking advantage of the correlation between the left and right channels, so that, by packaging four 16 M bit ROMs, a playback time of about ten and several minute may be realized. In view of the tendency towards a higher integration degree of semiconductor memories, mask ROMs with 128 M bits or 256 M bits would be commercially available in a not distant future. Since further improvement in the high efficiency encoding technique can be reckoned, it would be possible to transmit high quality high fidelity audio signals at 64 kbps per stereo-channel and to provide a one-chip audio signal software article with a playback time of 33 or 66 minutes.

Figure 9:
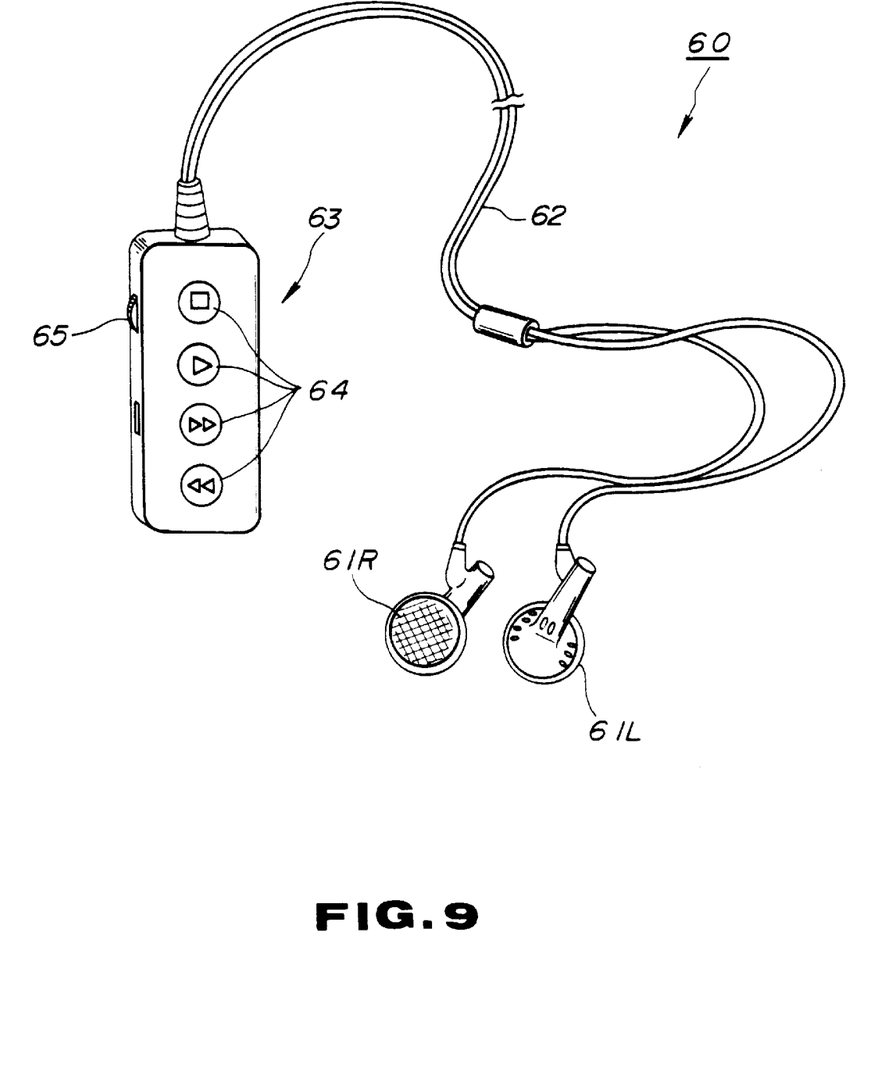
FIG. 9 is a perspective view showing a modification of a headphone device employed in the audio signal reproducing apparatus according to the present invention.

It will be noted that the audio signal reproducing apparatus according to the present invention may be applied not only to the usual headphone device shown in FIG. 2, but to a headphone device 60 in which the headphone driver units are exposed to outside, as shown for example in FIG. 9. With the headphone device 60, shown in FIG. 9, the headphone driven unit 61L, 61R are directly attached in the users' ears, and a main body of the playback circuit section 63 is connected to these driver units 61L, 61R by means of a signal transmission cord 62. The semiconductor memory 41, decoder 42, D/A converter 43 and batteries as the power source, shown in FIG. 1 are accommodated in the main body of the playback circuit section 63. On the other hand, an operational mode selector circuit 64 for controlling the playback operation and a volume dial 65 are provided on the outer surface of the main body of the playback circuit section 63, which may be implemented with the size and the shape of, for example, a pendant.

The present invention is not limited to the above described embodiment. For example, an audio signal reproducing apparatus may be constituted by circuit elements including and downstream of the semiconductor memory 41 in FIG. 1 or may additionally include the A/D converter 32 and the encoder 33. The playback circuit section or the batteries may also be accommodated in a thickened headphone band or in a headphone driver unit. The high efficiency compression encoding may be implemented by, for example, sub-band encoding, instead of by adaptive transform encoding as described in the foregoing embodiment. If such sub-band encoding technique is used, the signal may be divided by, for example, band-pass filters, into a plurality of frequency bands, and the allowable noise level may be set so as to be progressively higher towards the side of the higher frequencies for the same energy level.

What is claimed is:

1. A headphone-type audio signal reproducing apparatus comprising:

a user-removable semiconductor memory unit for storing digitized and high-efficiency compression encoded audio data;

a decoder for reading out data stored in the semiconductor memory unit and for decoding the read-out data by performing an inversion of the compression encoding;

a digital/analog converter for converting output signals from the decoder into analog signals;

a headphone unit for receiving the analog signals form the digital/analog converter and converting the analog signals from the digital/analog converter into acoustic sounds; and a lightweight housing for containing the semiconductor memory unit, the decoder, the digital/analog converter and the headphone unit, the lightweight housing being compact and adapted for placement on a user's head, wherein the audio data has been compression encoded by dividing input digital signals into a plurality of frequency bands such that bandwidths of the bands are broader for progressively higher frequency bands and each frequency band has a corresponding energy level, setting an allowable noise level on a band-by-band basis in accordance with the energy level of each frequency band, including setting the allowable noise level for a given energy level progressively higher for progressively higher frequencies, and quantizing the components of each band with a number of bits corresponding to a difference in level between the energy of each frequency band and the preset allowable noise level, including adjusting the number of bits allocated upon quantizing according to the allowable noise level, and wherein the decoder performs the inversion of the compression encoding.

2. The headphone-type audio signal reproducing apparatus according to claim 1, further comprising a battery for powering the decoder, the digital/analog converter, and the headphone unit and being arranged in the housing.

3. The headphone-type audio signal reproducing apparatus according to claim 1, wherein the headphone unit comprises a left earphone unit and a right earphone unit attached to the housing for placement at respective left and right ears of the user.

4. The headphone-type audio signal reproducing apparatus according to claim 1, wherein said semiconductor memory unit comprises a semiconductor chip with a playback time of at least 33 minutes.

5. A method for reproducing audio signals using a portable apparatus comprising the steps of:

storing digitized and high-efficiency compression encoded audio data in a user removable semiconductor memory;

reading out data stored in the semiconductor memory and decoding the read-out data by performing an operation that is an inversion of the compression encoding;

converting digital data output from the decoder into analog signals;

receiving the analog signals from the digital/analog converter and converting the analog signals from the digital/analog converter using an earphone unit into acoustic sounds for listening by the user; and containing the semiconductor memory, the decoder the digital/analog converter, and the earphone unit in a lightweight housing adapted for placement on a user's head, and wherein the operation of compression encoding comprises the steps of dividing input digital signals into a plurality of frequency bands such that bandwidths of the bands are broader for progressively higher frequency bands and each frequency band has a corresponds energy level, setting an allowable noise level on a band-by-band basis in accordance with the energy level of each frequency band, including setting the allowable noise level for a given energy level progressively higher for progressively higher frequencies, and quantizing the components of each band with a number of bits corresponding to a difference in level between the energy of each frequency band and the preset allowable noise level, including adjusting the number of bits allocated upon quantizing according to the allowable noise level.

* * * * *

(12) EX PARTE REEXAMINATION CERTIFICATE (6723rd)
United States Patent
Nishiguchi et al.

(10) Number: US 6,445,800 C1
(45) Certificate Issued: *Mar. 24, 2009

(54) AUDIO SIGNAL REPRODUCING APPARATUS

(75) Inventors: Masayuki Nishiguchi, Kanagawa (JP); Yoshihito Fujiwara, Kanagawa (JP)

(73) Assignee: Sony Corporation, Shinagawa-Ku, Tokyo (JP)

Reexamination Request:
No. 90/008,044, Jun. 8, 2006

Reexamination Certificate for:
Patent No.: 6,445,800
Issued: Sep. 3, 2002
Appl. No.: 09/489,774
Filed: Jan. 24, 2000

(*) Notice: This patent is subject to a terminal disclaimer.

Related U.S. Application Data

(62) Division of application No. 08/747,910, filed on Nov. 12, 1996, now Pat. No. 6,695,477, which is a division of application No. 07/600,818, filed on Oct. 22, 1990, now Pat. No. 5,640,458.

(30) Foreign Application Priority Data

Oct. 25, 1989 (JP) .......................................... PO1-278209

(51) Int. Cl.
*H04R 05/033* (2006.01)
*H04R 5/00* (2006.01)
*G11C 7/00* (2006.01)
*G11C 7/16* (2006.01)

(52) U.S. Cl. .............................. 381/74; 381/98; 700/94; 704/272

(58) Field of Classification Search ........................ None
See application file for complete search history.

(56) References Cited

U.S. PATENT DOCUMENTS

| 4,667,088 A | * | 5/1987 | Kramer et al. ............... 235/380 |
| 4,896,362 A | | 1/1990 | Veldhuis et al. |
| 4,933,675 A | | 6/1990 | Beard |
| 4,942,607 A | | 7/1990 | Schroder |
| 5,640,458 A | | 6/1997 | Nihiguchi et al. |
| 5,930,758 A | | 7/1999 | Nichiguchi et al. |

FOREIGN PATENT DOCUMENTS

| EP | 0 379 444 | 7/1990 |
| EP | 0 380 727 | 8/1990 |
| JP | 59-072487 | 4/1984 |
| JP | 59-174092 | 10/1984 |
| JP | 61-121500 | 7/1986 |
| JP | 62-031098 | 2/1987 |
| JP | 62-187898 | 8/1987 |
| JP | 62-168199 | 10/1987 |
| JP | 63-197100 | 8/1988 |
| JP | 01-064700 | 4/1989 |

OTHER PUBLICATIONS

"Transform Coding of Audio Signals Using Perceptual Noise Criteria", James D. Johnston, IEEE Journal on Selected Areas in Communications, vol. 6, No. 2, Feb. 1988, pp. 314–323.*

Krasner, Michael, "The Critical Band Coder—Digital Encoding of Speech Signals Based on the Perceptual Requirements of the Auditory System," *Acoustics, Speech, and Signal Processing, IEEE International Conference on ICASSP '80*, Apr. 1980, pp. 327–331.

(Continued)

Primary Examiner—Joseph R. Pokrzywa (57) ABSTRACT

A small-sized audio signal reproducing apparatus for hearing reproduced audio signals with the aid of a headphone is disclosed. Digitized and compression encoded audio signals, stored in a semiconductor memory, are read out so as to undergo a decoding operation, which is an inverse operation to compression encoding, to reproduce the audio signals, and the reproduced signals are heard by the headphone. The apparatus may be significantly reduced in size and weight as compared to the apparatus in which a tape or a disk is used as the recording medium.

OTHER PUBLICATIONS

Bloom, P.J., "High–Quality Digital Audio in the Entertainment Industry: An Overview of Achievements and Challenges," *IEEE ASSP Magazine,* vol. 2 No. 4, Oct. 1985, pp. 2–25.

Nakajima, H. "The Conception and Evolution of Digital Audio," *Solid–State Circuits Conference, 1989, Digest of Technical Papers, 36" ISSCC, 1989, International,* Feb. 1989.

U.S. Appl. No. 10/096,621, filed Mar. 13, 2002, 2002–0090097, Nishiguchi, et al.

U.S. Appl. No. 09/842,542, filed Apr. 26, 2001, Nishiguchi, et al.

U.S. Appl. No. 11/158,880, filed Jun. 22, 2005, Nishiguchi, et al.

U.S. Appl. No. 90/008,043, filed May 22, 2006, Nishiguchi, et al.

U.S. Appl. No. 90/007,908, filed Jan. 31, 2006, Nishiguchi, et al.

U.S. Appl. No. 90/008,042, filed May 22, 2006, Nishiguchi, et al.

U.S. Appl. No. 90/008,044, filed Jun. 8, 2006, Nishiguchi, et al.

U.S. Appl. No. 90/007,909, filed Jan. 31, 2006, Nishiguchi, et al.

* cited by examiner

US 6,445,800 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 5 are determined to be patentable as amended.

Claims 2–4, dependent on an amended claim, are determined to be patentable.

1. A headphone-type audio signal reproducing apparatus comprising:
   a user-removable semiconductor memory unit for storing digitized and high-efficiency compression encoded audio data;
   a decoder for reading out data stored in the semiconductor memory unit and for decoding the read-out data by performing an inversion of the compression encoding;
   a digital/analog converter for converting output signals from the decoder into analog signals;
   a headphone unit for receiving the analog signals [form] *from* the digital/analog converter and converting the analog signals from the digital/analog converter into acoustic sounds, *said headphone unit having a first speaker on a first side positioned to oppose a first ear of a user when in use, and a second speaker on a second side positioned to oppose a second ear of the user when in use*; [and]
   *a battery disposed on only one side of said headphone unit; and*
   a lightweight housing for containing the semiconductor memory unit, the decoder, the digital/analog converter and the headphone unit, the lightweight housing being compact and adapted for placement on a user's head *to form a self-contained audio signal reproducing apparatus, the semiconductor memory is held in only an opposite side of said headphone unit than said only side in which said battery is disposed, wherein*
   [wherein] the audio data has been compression encoded by dividing input digital signals into a plurality of frequency bands such that bandwidths of the bands are broader for progressively higher frequency bands and each frequency band has a corresponding energy level, setting an allowable noise level on a band-by-band basis in accordance with the energy level of each frequency band, including setting the allowable noise level for a given energy level progressively higher for progressively higher frequencies, and quantizing the components of each band with a number of bits corresponding to a difference in level between the energy of each frequency band and the preset allowable noise level, including adjusting the number of bits allocated upon quantizing according to the allowable noise level, and wherein the decoder performs the inversion of the compression encoding,
   *said user-removable, exchangeable semiconductor memory unit being configured to be removed by said user from said lightweight housing without also removing said decoder, and*
   *said headphone-type audio signal reproducing apparatus being configured to be carried by said user during normal playback operation.*

5. A method for reproducing audio signals using a portable apparatus comprising the steps of:
   storing digitized and high-efficiency compression encoded audio data in a user removable semicondcutor memory;
   reading out data stored in the semiconductor memory and decoding the read-out data by performing an operation that is an inversion of the compression encoding;
   converting digital data output from the decoder into analog signals;
   receiving the analog signals from the digital/analog converter and converting the analog signals from the digital/analog converter using an earphone unit into acoustic sounds for listening by the user; and
   containing the semiconductor memory, *a battery*, the decoder, the digital/analog converter, and the earphone unit in a lightweight housing adapted for placement on a user's head, *said earphone unit having a first side with a first speaker positioned opposite a user's first ear when in use, and a second side with a second speaker positioned opposite a user's second ear when in use, said battery being disposed in said first side of said earphone unit and said semiconductor memory being disposed in said second side of said earphone unit*, and wherein the operation of compression encoding comprises the steps of dividing input digital signals into a plurality of frequency bands such that bandwidths of the bands are broader for progressively higher frequency bands and each frequency band has a corresponds energy level, setting an allowable noise level on a band-by-band basis in accordance with the energy level of each frequency band, including setting the allowable noise level for a given energy level progressively higher for progressively higher frequencies, and quantizing the components of each band with a number of bits corresponding to a difference in level between the energy of each frequency band and the preset allowable noise level, including adjusting the number of bits allocated upon quantizing according to the allowable noise level, *wherein*
   *said semiconductor memory being configured to be removed from said lightweight housing without also removing the decoder, and*
   *said lightweight housing being configured to be carried by the user during normal playback operation.*

* * * * *